US008481360B2

(12) United States Patent
Smith et al.

(10) Patent No.: US 8,481,360 B2
(45) Date of Patent: Jul. 9, 2013

(54) ORGANIC ELECTRONIC DEVICE

(75) Inventors: Euan C. Smith, Cambridgeshire (GB); Gregory L. Whiting, Menlo Park, CA (US)

(73) Assignee: Cambridge Display Technology Limited, Cambridgeshire (GB)

( * ) Notice: Subject to any disclaimer, the term of this patent is extended or adjusted under 35 U.S.C. 154(b) by 863 days.

(21) Appl. No.: 12/439,161

(22) PCT Filed: Aug. 30, 2007

(86) PCT No.: PCT/GB2007/003283
§ 371 (c)(1),
(2), (4) Date: Oct. 13, 2009

(87) PCT Pub. No.: WO2008/025989
PCT Pub. Date: Mar. 6, 2008

(65) Prior Publication Data
US 2010/0019231 A1    Jan. 28, 2010

(30) Foreign Application Priority Data
Aug. 31, 2006 (GB) .................................. 0617128.4

(51) Int. Cl.
*H01L 51/10* (2006.01)
*H01L 51/40* (2006.01)

(52) U.S. Cl.
USPC .. 438/99; 257/40; 257/E51.006; 257/E51.005

(58) Field of Classification Search
USPC ............... 257/40, E51.005, E51.006; 438/99
See application file for complete search history.

(56) References Cited

U.S. PATENT DOCUMENTS

| 4,539,507 | A | 9/1985 | VanSlyke et al. |
| 6,306,559 | B1 | 10/2001 | Tanamura et al. |
| 6,852,995 | B1 | 2/2005 | Eccleston et al. |
| 8,012,791 | B2* | 9/2011 | Doll et al. .................. 438/99 |
| 2003/0059975 | A1 | 3/2003 | Sirringhaus et al. |

(Continued)

FOREIGN PATENT DOCUMENTS

| EP | 880303 | 11/1998 |
| JP | 61-133667 A | 6/1986 |

(Continued)

OTHER PUBLICATIONS

International Search Report for PCT/GB2007/003283 dated Jul. 8, 2008.

(Continued)

*Primary Examiner* — Calvin Lee
*Assistant Examiner* — Scott Stowe
(74) *Attorney, Agent, or Firm* — Marshall, Gerstein & Borun LLP

(57) ABSTRACT

This invention generally relates to organic electronic devices and to methods for their fabrication. More particularly we will describe organic thin film transistor (TFT) structures and their fabrication.
An organic electronic device, the device comprising: a substrate supporting a first electrode; a spacer structure over said substrate; a second electrode over said spacer structure and at a height above said first electrode; and a layer of organic semiconducting material over said first and second electrodes to provide a conducting channel between said first and second electrodes; and wherein a majority of said first electrode is laterally positioned to one side of said channel and a majority of said second electrode is laterally positioned to the other side of said channel.

20 Claims, 5 Drawing Sheets

U.S. PATENT DOCUMENTS

| | | | | |
|---|---|---|---|---|
| 2004/0029310 A1* | 2/2004 | Bernds et al. | ................... | 438/99 |
| 2007/0102697 A1* | 5/2007 | Chen et al. | ...................... | 257/40 |
| 2007/0254402 A1* | 11/2007 | Dimmler et al. | ................ | 438/99 |
| 2008/0237580 A1* | 10/2008 | Okuyama et al. | ............... | 257/40 |

FOREIGN PATENT DOCUMENTS

| | | |
|---|---|---|
| JP | 61-234078 A | 10/1986 |
| JP | 01-209765 A | 8/1989 |
| JP | 2001-015267 A | 1/2001 |
| JP | 2003-318407 A | 11/2003 |
| WO | WO-90/13148 | 11/1990 |
| WO | WO-95/06400 | 3/1995 |
| WO | WO-99/21935 | 5/1999 |
| WO | WO-99/42983 | 8/1999 |
| WO | WO-99/48160 | 9/1999 |
| WO | WO-02/067343 | 8/2002 |
| WO | WO-03/038790 | 5/2003 |
| WO | WO-2005/071771 | 8/2005 |
| WO | WO-2005/076386 | 8/2005 |

OTHER PUBLICATIONS

Yutani et al., "Fabrication of Vertical Organic Field Effect Transistor at the Edge of Patterned Photoresist," *Molecular Crystal and Liquid Crystal Sci. and Tech.*, 444:197-202 (2006).

Stutzmann et al., "Self-aligned, Vertical-Channel, Polymer Field-Effect transistors," *Sc.i, Am. Assn. for the Advancement of Sci., US*, 299:1881-1884 (2003).

Parashkov et al., *Appl. Phys. Lett.*, 82:4759-4580 (2003).

Reiser A., "Photoreactive Polymers," Wiley, New York, 1089:39, 1989.

Di et al., "Noncoplanar Organic Field-Effect Transistor Based on Copper Phthalocyanine," Appl. Phys. Ltrs., 88:121907-1-121907-3 (2006).

Parashkov et al., "Organic Vertical-Channel Transistors Structured Using Excimer Laser," Appl. Phys. Ltrs., 85(23):5751-5753 (2004).

\* cited by examiner

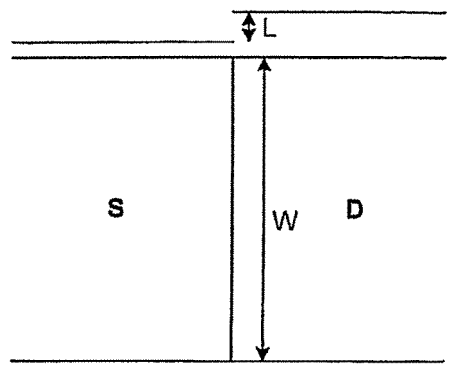
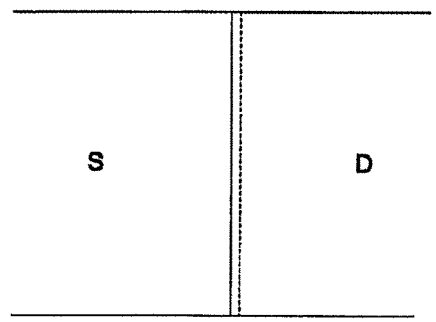
Figure 3a         Figure 3b
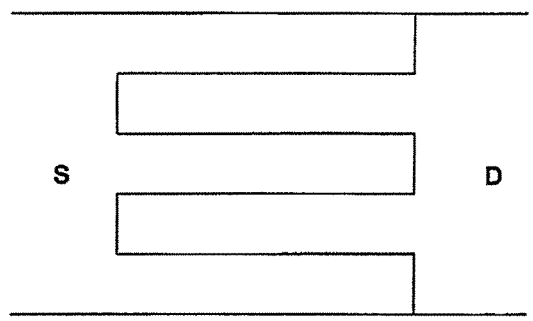
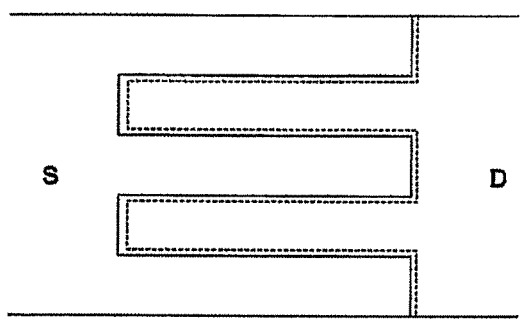
Figure 3c         Figure 3d
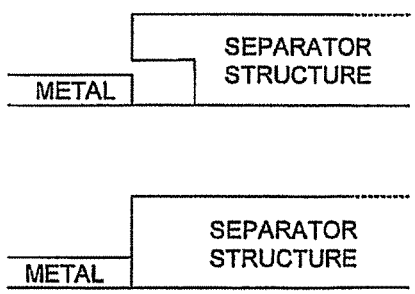
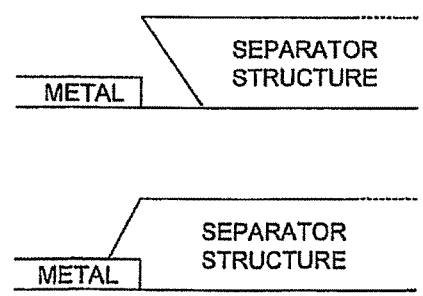
Figure 2

ORGANIC ELECTRONIC DEVICE

BACKGROUND OF THE INVENTION

1. Field of the Invention

This invention generally relates to organic electronic devices and to methods for their fabrication. More particularly we will describe organic thin film transistor (TFT) structures and their fabrication.

2. Related Technology

There is a general need for improved organic electronic devices, in particular thin film transistor devices. One technique for fabricating vertical-channel polymer field-effect transistors is described in, "Self-aligned vertical-channel, polymer field-effect transistors" by N. Stutzmann, R. H. Friend, and H. Sirringhaus, Science, Vol. 299, 21 Mar. 2003, pages 1881-1884). Broadly speaking this describes a technique in which layers of the device are micro cut by a sharp wedge to provide access from the side to electrically conductive layers. This technique is useful for providing a short gate length but a device structure and fabrication method which lends itself more readily to manufacturing would be beneficial.

Parashkov et al, Appl. Phys. Lett. 82(25), 4759-4580, 2003 discloses a vertical-channel thin film transistor wherein a drain electrode is provided on a substrate; a photoresist is deposited over the drain electrode; a layer of organic conductive material PEDOT:PSS is deposited over the photoresist; the layer of PEDOT:PSS is patterned to form a source electrode; the layer of photoresist is patterned to expose the drain electrode; and the organic semiconducting material, gate dielectric and gate electrode are then deposited over the source and drain electrodes to complete the device. Again, a device structure and fabrication method which lends itself more readily to manufacturing of a vertical-channel device would be beneficial.

SUMMARY OF THE INVENTION

According to the present invention there is therefore provided a method of fabricating an organic thin film transistor on a substrate the method comprising:

depositing a separator layer on said substrate;

patterning said separator layer to define a source-drain separator;

depositing conductive material on said substrate bearing said source-drain separator to define source and drain electrodes of said transistor;

depositing organic semiconducting material over said source and drain electrodes;

depositing dielectric material over said organic semiconducting material; and depositing conductive material over said dielectric material to provide a gate electrode for said transistor.

Preferably, one of the source and drain electrodes is formed over the separator structure at a first height, and the other of the source and drain electrodes is formed over the substrate at a second, lower height.

Preferably, the source and drain electrodes are separated by a distance of less than 10 μm.

Preferably, the separator layer is formed from photoresist material, and the separator layer is patterned by photopatterning to form the source-drain separator.

In one preferred embodiment, the source-drain separator has an undercut edge.

Preferably, the conductive material forming the source and drain electrodes is deposited by evaporation or sputtering.

Preferably, said forming of said source and drain electrodes comprises directional deposition of electrode material at an angle such that a shadow of an edge of said separator structure defines an electrode edge.

Preferably, the conductive material forming the source and drain electrodes comprises a metallic element.

Preferably, the conductive material forming the source and drain electrodes consists essentially of an elemental metal or an alloy thereof.

Preferably, at least one of the organic semiconducting material, the dielectric material and the gate electrode are deposited from a solution in a solvent.

In another aspect, the invention provides an organic electronic device, the device comprising: a substrate supporting a first electrode; a spacer structure over said substrate; a second electrode over said spacer structure and at a height above said first electrode; and a layer of organic semiconducting material over said first and second electrodes to provide a conducting channel between said first and second electrodes; and wherein substantially all the first electrode is laterally positioned to one side of the channel and substantially all the second electrode is laterally positioned to the other side of the channel.

Thus, the first and second electrodes are substantially non-overlapping laterally.

Preferably said height is defined by a thickness of said spacer layer; preferably it is less than 10 μm, 5 μm, 2 μm, or 1 μm. The spacer structure may comprise a layer of electrically insulating material (in this specification the terms "insulating" and "dielectric" are used synonymously) but, as will be appreciated from the described embodiments, this is not essential.

The layer of insulating material preferably has a substantially vertical or, more preferably, undercut edge at the channel. The layer of insulating material may comprise a layer of resist material which may be etched, for example, anisotropically to produce such an undercut edge.

The organic electronic device may comprise one of a range of devices including, but not limited to, a diode device, a thyristor device, and the like. However in some particularly preferred embodiments the device comprises a transistor, more specifically a field effect transistor such as a polymer field effect transistor. In this case the first and second electrodes provide source and drain electrodes for the transistor and the device further comprises a layer of gate dielectric over the organic semiconducting material, more particularly over the channel of the transistor, and a gate electrode over the gate dielectric. In embodiments the gate electrode overlies the source and drain electrodes without an intervening conducting layer—that is there is no conducting layer, at least in the vicinity of the channel, between the gate electrode and the drain electrode and between the gate electrode and the source electrode.

(The skilled person will understand that references to a conducting channel are not limited to references to a channel in a field effect device and include, for example, a one-way conduction channel of a diode). The skilled person will appreciate that such a field effect transistor may operate in either enhancement or depletion mode.

In embodiments of the invention a double transistor structure is provided comprising two transistors each as described above. In such an arrangement one of the source/drain electrodes may be common to both the transistors; in particular this is the electrode over the spacer structure. Such a double transistor structure may lack an external connection to this common or shared electrode. Such a double transistor structure can provide improved functionality, such as better switching isolation.

Organic thin film transistor embodiments of the above-described structure provide a number of advantages. One advantage is the extremely short gate length which is achievable in such vertical devices as compared with lateral devices. In a typical lateral device a gate length (a distance between the source drain electrodes) may be of the order of 10 μm whereas in structures according to embodiments of the invention a gate length of 1 μm, 0.5 μm, 0.2 μm, 0.1 μm or less is readily achievable. A short gate length provides advantages such as an increased source-drain current.

This invention further provides an organic electronic device, the device comprising: a substrate; a first electrode over said substrate at a first height above said substrate; a spacer structure over said substrate; a second electrode over said spacer structure and at a second height, greater than said first height, above said substrate; and a layer of organic semiconducting material over said first and second electrodes to provide a conducting channel between said first and second electrodes; and wherein there is substantially no lateral overlap between said first and second electrodes.

The above-mentioned increase source-drain current is particularly useful for organic light emitting diode (OLED) displays, especially for driver transistors of an active matrix OLED display.

Thus in a further aspect the invention provides an active matrix OLED display, the display having a plurality of pixels, each said pixel having associated pixel driver circuitry, and wherein said pixel driver circuitry includes at least one organic thin film transistor (TFT) in which one of a drain and source electrode of said organic TFT is vertically disposed above a substrate of said display at a different height to the other of said drain and source electrode of said organic TFT.

A further advantage of the organic TFT structures we describe is the very high uniformity of gate length which is achievable. For example across a substrate of dimension greater than, say, 5 cm or 10 cm the gate length uniformity may be better than 10%, 5%, 2% or 1%. Expressing this differently the aforementioned uniformity may be achieved across, for example, greater than 1,000,000 or greater than 10,000,000 organic thin film transistors. Consider, for example, a display comprising approximately 500 pixels resolution on each axis (row and column). If the display is a colour display there are 1500 pixels on each axis and, for a typical active matrix driver, 4 transistors per pixel giving 6,000 transistors per axis for approximately 36,000,000 transistors over the area of the display.

Thus an active matrix OLED display as described above may comprise greater than 1,000,000 or greater than 10,000,000 transistors with a gate length uniformity of better than 10%, 5%, 2% or 1%.

In a complementary aspect the invention provides a method of fabricating an organic electronic device on a substrate, the method comprising: providing said substrate with a first electrode for said organic electronic device; forming a separator structure on said substrate; forming a second electrode for said organic electronic device over said separator structure; and depositing a layer of organic semiconducting material over said first and second electrodes; and wherein said separator structure comprises a layer of insulating material, and wherein said forming of said separator structure comprises forming said second electrode over said layer of insulating material and then patterning said layer of insulating material using said second electrode as an etch mask and/or photomask.

As will be described later the different stages of the method may be performed in a number of different orders, depending upon the embodiment of the method employed.

In embodiments the layer of insulating material may be deliberately under-etched, so that an edge of the separator structure slopes down to the substrate, more particularly to the first electrode, rather than having a vertical edge. In embodiments the separator structure is formed such that it partially overlaps an edge of the first electrode adjacent a channel of the device.

In further embodiments of the method a double TFT structure may be fabricated in which the electrode on the separator structure acts as a common source or drain electrode for the pair of transistors.

In a further related aspect of the invention there is provided a method of fabricating an organic thin film transistor on a substrate the method comprising: depositing a first layer of conductive material on said substrate and patterning said first layer of conductive material to define a first source or drain electrode of said transistor; depositing a layer of insulating material on said substrate over said first electrode; depositing a second layer of conductive material over said layer of insulating material and patterning said second layer of conductive material to define a second, drain or source electrode of said transistor; patterning said layer of insulating material using said second electrode as an etch mask and/or photomask to expose at least part of said first electrode; depositing organic semiconducting material over said first and second electrodes; depositing gate dielectric material over said organic semiconducting material; and depositing conductive material over said dielectric material to provide a gate electrode for said transistor.

In embodiments of these methods it will be appreciated that the depositing of the organic semiconductor material over the first and second electrodes creates a channel for the transistor, and the gate dielectric is then deposited over this channel, followed by a gate electrode. Generally vias, connections to other devices and the like may also be formed.

Further aspects of the invention provide a device, transistor, and display, in particular OLED display, fabricated using a method as described above.

The skilled person will appreciate that features and aspects of the above-described structures and methods may be combined in any permutation.

BRIEF DESCRIPTION OF THE DRAWINGS

These and other aspects of the invention will now be further described, by way of example only, with reference to the accompanying figures in which:

FIG. 2 shows schematically, some example alternative configurations of the edge of the separator structure shown in FIG. 1;

FIGS. 3a to 3d schematically illustrate a view from above of example alternative configurations for the source and drain electrodes of the transistors of FIGS. 1 and 4 respectively;

DETAILED DESCRIPTION

Figure 1:
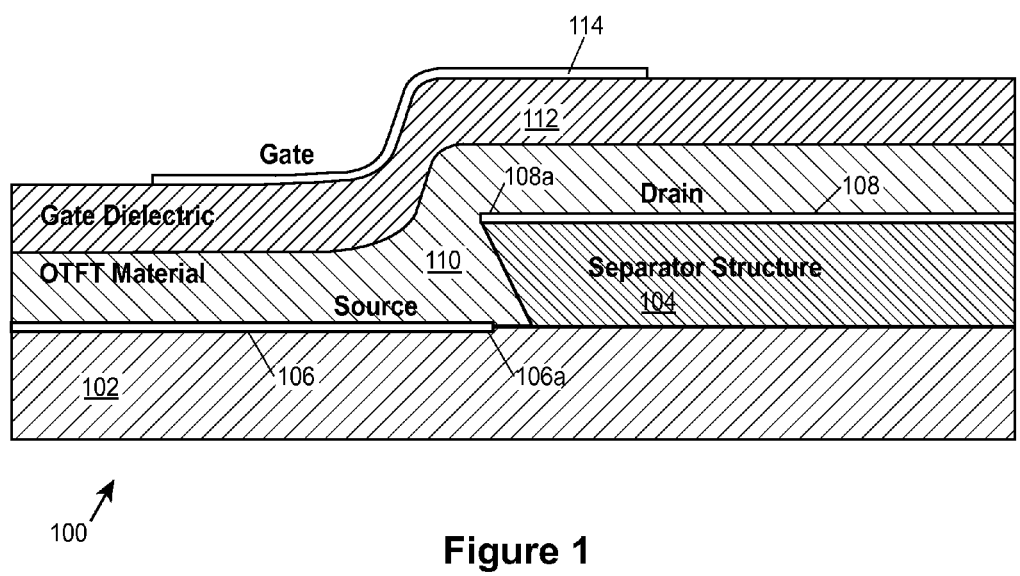
FIG. 1 shows a first example of a thin film transistor according to an embodiment of the invention.

Referring now to FIG. 1, this shows an example of a preferred embodiment of a thin film transistor device structure 100 according to the invention. The TFT structure comprises a substrate 102 on which is fabricated a separator structure 104 followed by source and drain electrodes 106, 108. A layer of organic thin film transistor material 110, generally an organic semiconductor such as a polythiophene derivative is then deposited over the source and drain followed by a layer of gate dielectric material 112 and then a gate electrode 114. In operation a channel is formed between the edges 106a, 108a of the source and drain electrodes also extending over a part of the top surface of the source electrode near edge 106a and also generally extending over a part of the top surface of the drain electrode near edge 108a. Although not shown in FIG. 1 a practical device may also conclude one or more vias within the separator structure within the separator structure 104.

Example materials for the TFT of FIG. 1 are as follows:

Substrate: glass or plastic; a flexible plastic such as polycarbonate or polyethylene terephthalate (PET).

Separator structure: positive or negative photo resist.

Source/drain: aluminium; a combination of aluminium and chrome layers, for example aluminium sandwiched between layers of chrome. More generally any metal providing an appropriate ohmic connection to the organic semiconductor. Other examples include gold or palladium for a p-channel device; calcium or barium for an n-channel device.

Organic semiconductor: polythiophene or derivative thereof; polyaniline or derivative thereof; pentacene or derivatives thereof.

Gate dielectric: BCB (Benzocyclobutene); the gate dielectric may also be inorganic, for example SiOx or SiNx.

Gate: as for source/drain; also the gate material may be a polymer such as Poly(3,4-ethylenedioxythiophene) (PEDOT) or more specifically comprising poly(styrene sulfonate)—(PEDOT:PSS).

Example layer thicknesses are as follows.

Source/drain: 5 nm-500 nm preferably 10 nm to 150 nm, for example approximately 50 nm (a minimum thickness of 5 nm is generally required to achieve electrical continuity).

Organic semiconductor: 50 nm-500 nm, for example 100 nm

Gate dielectric: 50 nm-500 nm, for example 100 nm.

Gate: 5 nm-500 nm, preferably 10 nm to 150 nm, for example approximately 50 nm (a minimum thickness of 5 nm is generally required to achieve electrical continuity).

Separator structure: Preferably the separator has a minimum thickness of 50 nm, more preferably a minimum thickness of 100 nm.

The height of the separator structure may be chosen in accordance with a desired gate length for the transistor. For example the height (gate length) may be less than 10 µm, 5 µm, 2 µm, 1 µm or 500 nm. In some preferred embodiments the separator structure, and hence gate length, is less than 1 µm; in general a lower step height facilitates good step coverage by the overlying layers. It will be appreciated that the gate length (the source-drain gap) is substantially equal to the height of the separator structure (ignoring channel "end effects").

The source, drain and gate electrodes may be deposited by a range of techniques including, for example, physical vapour deposition. The gate metal (and in later described embodiments the source and drain metal) may be patterned by conventional photolithographic techniques. Alternatively (but less preferably) a shadow mask may be employed.

The organic semiconductor and gate dielectric materials may be deposited by a range of techniques including solution processing techniques, including but not limited to, ink jet printing, spin coating (afterwards removing material from unwanted areas by plasma etching or laser ablation), stamp contact, offset lithography, screen printing and roll-printing (suitable printers for the latter for the deposition of organic materials are available from Toppan Printing Co. Ltd of Tokyo, Japan).

In one preferred fabrication method the fabrication steps are as follows:

1. Deposit and pattern the separator structure.
2. Evaporate source/drain metal and pattern to define source/drain electrodes.
3. Deposit organic semiconductor (OTFT material) over the source and drain electrodes and pattern if/as required.
4. Deposit gate dielectric and pattern if/as required.
5. Deposit and pattern gate metal.

Referring again to FIG. 1, it can be seen that the separator structure 104 is undercut. This allows the source and drain metal to be deposited in a single (self-aligned/self-shadow masked) step in which the separator structure prevents the source and drain electrodes from coming into direct contact at the channel of the device.

To fabricate an undercut separator a variety of techniques may be employed. Preferably a photodefinable polymer or photoresist such as polyimide or an acrylic photoresist is lithographically patterned using a mask or reticle and then developed to produce a desired channel-edge face angle. Either a positive or a negative photoresist may be employed (for example there are image reversal methods which may be employed to reverse an image in a positive resist). To obtain an undercut photoresist the photoresist may be under-(or over-) exposed and overdeveloped; optionally an undercut profile may be assisted by soaking in a solvent prior to development. Rather than an edge face with a uniform slope, the separator structure may also be etched to define an undercut shelf, for example by using a wet or dry isotropic etch process. The skilled person will be aware that there are many variations of the basic spin, expose, bake, develop, and rinse procedure used in photolithography (see, for Example, A. Reiser, *Photoreactive Polymers*, Wiley, New York, 1089, page 39, hereby incorporated by reference). Some particularly suitable resist materials are available from Zeon Corporation of Japan, who supply materials adapted for the fabrication of organic electroluminescent displays (negative resist materials in the ELX series, and positive resist materials in the WIX series).

Referring now to FIG. 2, this shows some alternative configurations for the edge of the face of the separator structure adjacent the channel of the device. Thus it can be seen that in embodiments an undercut is not necessary. In this case a small source-drain gap may be formed by depositing the source-drain metal at an angle (or range of angles) beyond the rising slope of the separator structure. This has the advantage of coating, and providing (electrical) continuity on the opposing slope, which might be helpful in some structures. Use of a separator structure without an undercut is particularly convenient when the separator is not formed using conventional photolithography, for example where the structure is formed by stamping where an undercut profile can be difficult to achieve.

Referring now to FIGS. 3a and 3c, these show views from above of the source and drain electrodes of a transistor constructed according to the method of FIG. 1, illustrating the gate width (W) and gate length (L). As can be seen the gate length can be made very small and the gate width can be made large, particularly with the serpentine-type structure of FIG. 3c. This is advantageous because the source drain current in a thin film transistor is proportional to the ratio W/L and hence by making W large and L small the source drain current can be increased for a given gate voltage or, similarly, a reduced gate voltage can be employed. A further important advantage arising from the structure of FIG. 1 is the very high uniformity of gate length which is achievable, because the uniformity of the gate length is determined by the uniformity of the layer thickness rather than by the lateral patterning (which is generally lower resolution).

Figure 4:
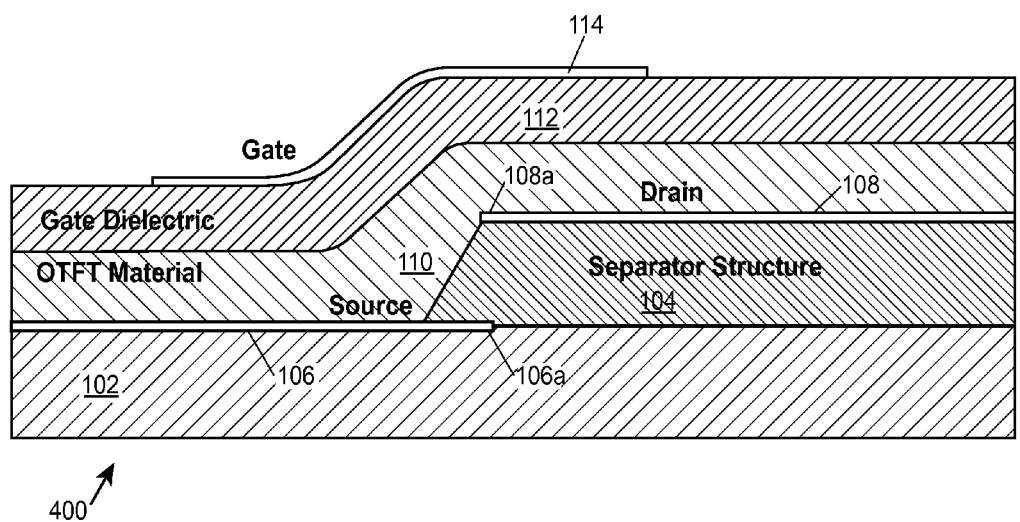
FIG. 4 shows a second example of a thin film transistor according to an embodiment of the invention.

Referring to FIG. 4, this shows a second example of an embodiment of a thin film transistor according to the invention, in which like elements to those of FIG. 1 are illustrated by like reference numerals. The transistor of FIG. 4 provides similar advantages to those described above but the fabrication technique and some elements of the structure differ. In particular, the source and drain electrodes are formed in separate steps, a layer of insulating material being deposited over the substrate and partially over an edge of the source electrode adjacent the channel prior to deposition of the drain electrode. Because separate metal layers are employed the source and drain may overlap slightly, for example by less than 15 µm, 10 µm, 5 µm or 2 µm, although preferably there is no overlap. The skilled person will nonetheless recognise that compared with the vertical device described in the Science paper mentioned in the introduction there is substantially no overlap of the source and drain electrodes. One advantage of the structure of FIG. 4 is that, in operation, its behaviour is closer to a conventional, lateral thin film field effect transistor. One potential disadvantage is that fabrication of the structure uses more steps than fabrication of the structure of FIG. 1, although in practice this may not be a disadvantage since additional steps may in any case be employed for fabrication of other structures on the substrate, for example depending upon the track requirements of a design for an OLED display panel into which the transistor is incorporated.

The examples of materials and layer thicknesses described above in relation to FIG. 1 also apply to the FIG. 4 embodiment. However because (as described further below) the source electrode is patterned prior to deposition of the drain it may be convenient to purchase a substrate on which an electrode layer such as ITO (indium tin oxide) has already been deposited in preparation for patterning to define the source electrode and other connections.

As illustrated in FIG. 4, the channel-edge face of the layer of insulating material 104 makes a positive angle with the underlying substrate (as opposed to the negative angle of the undercut shown in FIG. 1)—that is, it tapers towards the substrate—and this has the advantage of facilitating coverage of the step.

In a example method of fabrication of the structure of FIG. 4, the fabrication steps are as follows.

1. Deposit and pattern first electrode (source, or drain).
2. Coat substrate with insulating material 104.
3. Deposit and pattern second electrode (source, or drain).
4. Etch away the insulating material 104 not protected by the second electrode metal, intentionally under-etching to leave a positive slope.
5. Deposit semiconductor (organic TFT) material (for example, by any of the methods described above) and pattern as/if necessary.
6. Deposit dielectric material and pattern as/if necessary.
7. Deposit and pattern gate electrode metal.

Depending upon the structural device in which the TFT is incorporated a step between steps 3 and 4 above may be included to add one or more vias.

Referring to FIGS. 3b and 3d, which in an analogous manner to FIGS. 3a and 3c for FIG. 1, show a view from above of the source and drain electrodes of the TFT structure of FIG. 4. It can be seen that, in this example, there is a slight overlap between the source and drain electrodes.

Figure 5A:
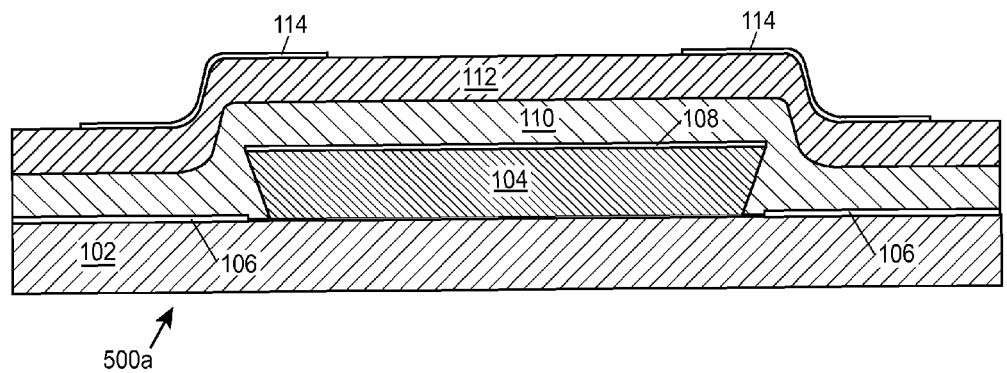
FIGS. 5a to 5c show, respectively, first and second examples of a double transistor structure based upon the structures of FIGS. 1 and 4; and a circuit for the double transistor structure of FIG. 5a/b.
Figure 5B:
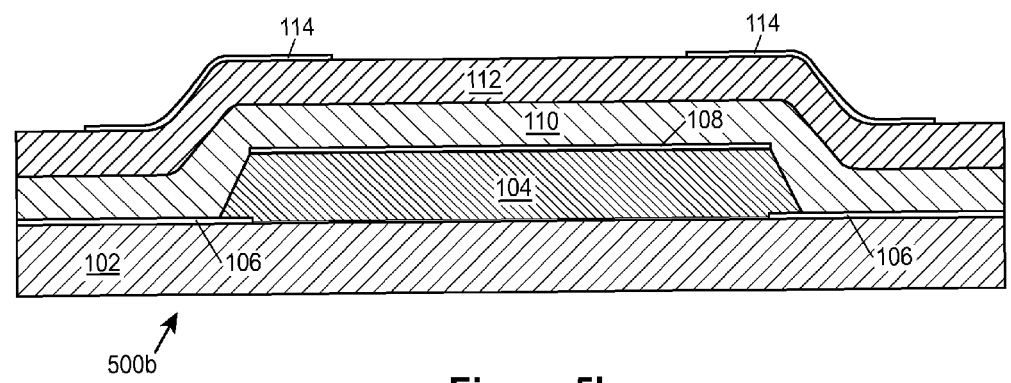
Figure 5C:
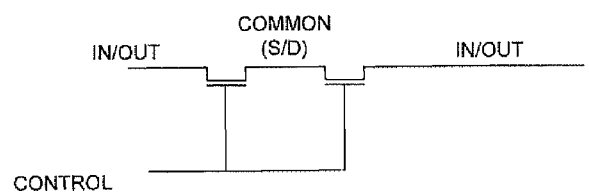

Referring next to FIGS. 5a and 5b, this shows first and second examples of a double transistor structure based upon the structures of FIGS. 1 and 4 respectively (like elements being indicated by like reference numerals). Broadly speaking the separator structure or insulating layer 104 is provided with two channel-defining faces, for example opposing one another. In embodiments of this double structure the drain (or source) electrode 108, that is the electrode deposited over the separator structure/insulator 104, has no external connections but comprises a common drain (or source) connection for the two transistors. Although as illustrated in FIGS. 5a and 5b the gate connections for the two transistors may be separate, in other preferred embodiments the gate metal is extended to provide a single, common gate connection for both devices. In this way the structure may have a circuit as shown in FIG. 5c comprising a pair of series-connected field effect transistors with a common gate (control) connection. This has the advantage of increased isolation when the devices are switched off (not selected).

A transistor of the type described above may be incorporated into an active matrix electroluminescent display, in particular an OLED (organic light emitting diode) display the transistor may be used to facilitate a larger drive current or lower control voltage and/or for a double structure, better isolation. Importantly, however, the above-described devices enable the fabrication of transistors with very uniform gate length over the area of a display. Device uniformity presents a particular problem in the context of displays because, unlike integrated circuits in which as device size shrinks the overall area of the IC shrinks, in a display the tendency is for the overall area to stay the same size or to increase whilst there is a desire to reduce the size of drive circuitry in order, for example, to increase aperture ratio.

Displays fabricated using OLEDs provide a number of advantages over LCD and other flat panel technologies. They are bright, colourful, fast-switching (compared to LCDs), provide a wide viewing angle and are easy and cheap to fabricate on a variety of substrates. Organic (which here includes organometallic) LEDs may be fabricated using materials including polymers, small molecules and dendrimers, in a range of colours which depend upon the materials employed. Examples of polymer-based organic LEDs are described in WO 90/13148, WO 95/06400 and WO 99/48160; examples of dendrimer-based materials are described in WO 99/21935 and WO 02/067343; and examples of so called small molecule based devices are described in U.S. Pat. No. 4,539,507.

A typical OLED device comprises two layers of organic material, one of which is a layer of light emitting material such as a light emitting polymer (LEP), oligomer or a light emitting low molecular weight material, and the other of which is a layer of a hole transporting material such as a polythiophene derivative or a polyaniline derivative.

Organic LEDs may be deposited on a substrate in a matrix of pixels to form a single or multi-colour pixellated display. A multicoloured display may be constructed using groups of red, green, and blue emitting pixels. So-called active matrix (AM) displays have a memory element, typically a storage capacitor and a transistor, such as described above, associated with each pixel. In a bottom-emitting display light is emitted through the substrate on which the active matrix circuitry is fabricated; in a top-emitting display light is emitted towards a front face of the display so avoiding the active matrix circuitry (an example is described in WO 2005/071771, incorporated by reference). Examples of polymer and small-molecule active matrix display drivers can be found in WO 99/42983 and EP 0,717,446A respectively (also incorporated by reference).

Figure 6A:
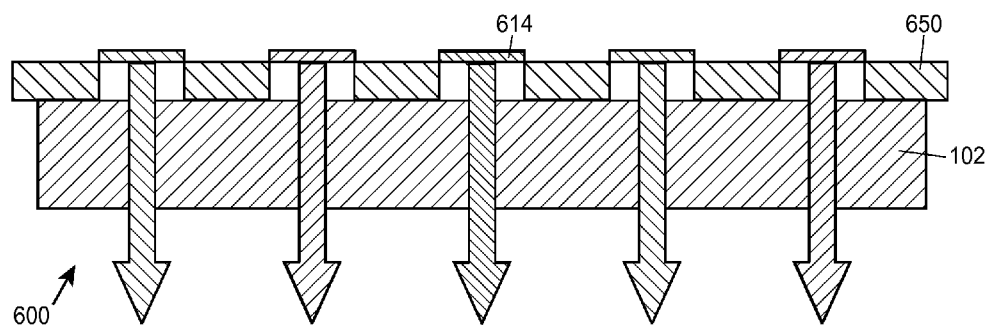
FIGS. 6a to 6c show, respectively, a schematic diagram of a bottom-emitting OLED display, a vertical cross-section through a portion of a light emitting pixel of the display of FIG. 6a, and an example driver circuit for an active matrix OLED display.
Figure 6B:
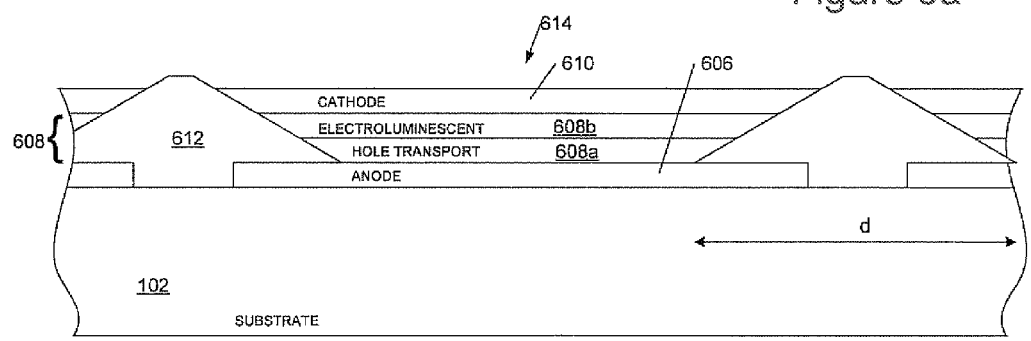

FIG. 6a schematically illustrates a bottom-emitting OLED display 600 respectively in which substrate 102 bears an active matrix driver circuit 650 for each pixel, over which is provided an OLED pixel 614. FIG. 6b shows details of an example OLED structure comprising an anode layer 606 such as ITO, over which one or more layers of OLED material 608 are deposited in wells defined by banks 612, for example by spin coating and subsequent patterning, or by selective deposition using an inkjet-based deposition process (see, for example, EPO 880 303 or WO2005/076386). In the case of a polymer-based OLED layers 608 comprise a hole transport layer 608a and a light emitting polymer (LEP) electroluminescent layer 608b. The electroluminescent layer may comprise, for example, PPV (poly(p-phenylenevinylene)) and the hole transport layer, which helps match the hole energy levels of the anode layer and of the electroluminescent layer, may comprise, for example, PEDOT:PSS (polystyrene-sulphonate-doped polyethylene-dioxythiophene). A multilayer cathode 610 overlies the OLED material 608 and typically comprises a low work function metal such as calcium (optionally with layer of material such as barium fluoride adjacent the LEP for improved electron energy level matching) covered with a thicker, capping layer of aluminium (in top-emitters the cathode layer is kept sufficiently thin to be substantially transparent). Mutual electrical isolation of cathode lines may be achieved or enhanced through the use of cathode separators similar to separator structure 104 (not shown in the Figure).

Figure 6C:
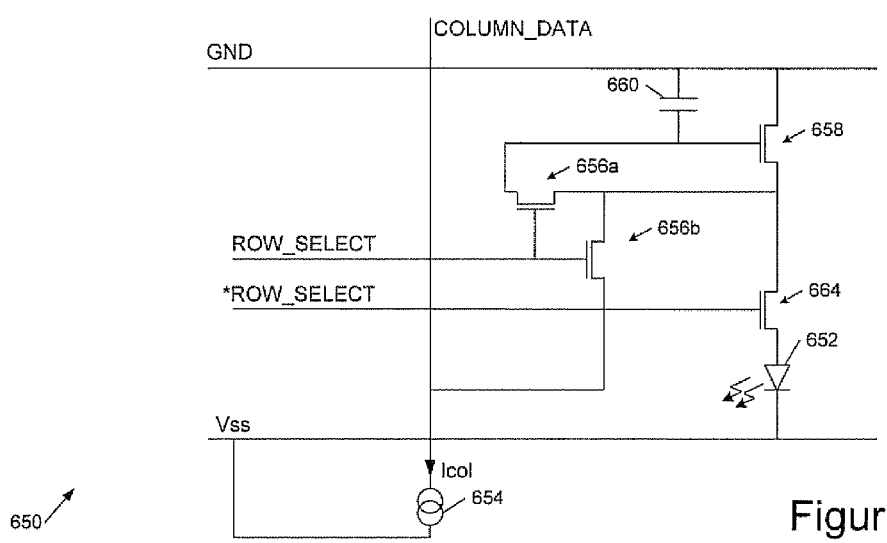

FIG. 6c, which is taken from our application WO03/038790, shows an example of a current-controlled active matrix pixel driver circuit 650. In this circuit the current through an OLED 652 is set by using transistors 656a,b to set a drain source current for OLED driver transistor 658 (using a reference current sink 654) and to memorise the driver transistor gate voltage required for this drain-source current on a capacitor 660. Thus the brightness of OLED 652 is determined by the current, $I_{col}$, flowing into reference current sink, which is preferably adjustable and set as desired for the pixel being addressed. In addition, a further switching transistor 664 is connected between drive transistor 658 and OLED 652. In general one current sink is provided for each column data line.

In this example driver circuit transistor 658 may have a structure as described above for increased drain-source current for a given gate voltage. Transistors 656b and 664 may have a structure as described above for similar reasons and, additionally, may be fabricated as a double device of the general type shown in FIG. 5 for improved isolation. Transistor 656a may have a structure as described above for improved isolation.

Figure 7:
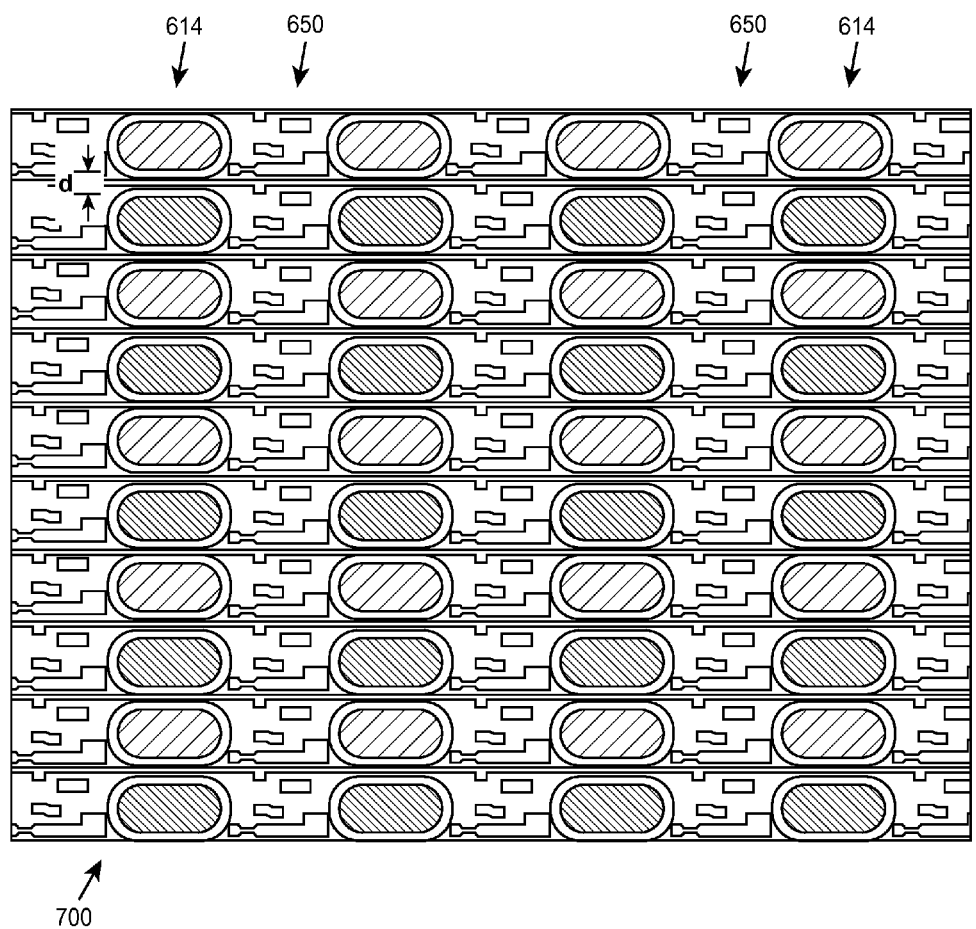
FIG. 7 shows a view from above of a portion of a complete active matrix OLED display within which a transistor according to an embodiment of the invention may be incorporated.

FIG. 7 shows a view from above of a portion of an active matrix OLED display 700 which may advantageously incorporate a transistor structure as described above. Like elements to those described above are described by like reference numerals.

Although some preferred embodiments of the above-described structures have been described with specific reference to the fabrication of a thin film transistor, in particular a field-effect transistor, the skilled person will understand that the above-described structures may also be employed to fabricate other types of electronic device including, but not limited to, a diode, thyristor and the like. The skilled person will also recognise that in the above-described embodiments of the TFT structures the labelling of the source and drain electrodes may be exchanged so that the electrode on the separator structure or insulator may be, for example, the source rather than the drain electrode. Likewise enhancement or depletion mode devices may be fabricated.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of fabricating an organic electronic device on a substrate, the method comprising:
   providing said substrate with a first electrode for said organic electronic device;
   forming a separator structure on said substrate;
   forming a second electrode for said organic electronic device over said separator structure; and
   depositing a layer of organic semiconducting material over said first and second electrodes; and
   wherein said separator structure comprises a layer of insulating material, and wherein said forming of said separator structure comprises forming said second electrode over said layer of insulating material and then patterning said layer of insulating material using said second electrode as an etch mask and/or photomask.

2. A method as claimed in claim 1 wherein said forming of said separator structure comprises forming said structure such that it partially overlaps said edge of said first electrode.

3. A method of forming an organic thin film transistor (TFT) comprising employing the method of claim 1 to fabricate a source electrode and a drain electrode of said transistor, followed by deposition of a dielectric layer and deposition of a gate layer of said transistor.

4. A method of forming a double TFT structure using the method of claim 3, wherein said second electrode forming comprises forming a common source or drain electrode for said double TFT structure.

5. A method of fabricating an organic thin film transistor on a substrate the method comprising:
   depositing a first layer of conductive material on said substrate and patterning said first layer of conductive material to define a first source or drain electrode of said transistor;
   depositing a layer of insulating material on said substrate over said first electrode;
   depositing a second layer of conductive material over said layer of insulating material and patterning said second layer of conductive material to define a second, drain or source electrode of said transistor;
   patterning said layer of insulating material using said second electrode as an etchmask and/or photomask to expose at least part of said first electrode;

depositing organic semiconducting material over said first and second electrodes;

depositing gate dielectric material over said organic semiconducting material; and depositing conductive material over said dielectric material to provide a gate electrode for said transistor.

6. A method of fabricating an organic thin film transistor on a substrate the method comprising:

depositing a separator structure on said substrate;

patterning said separator structure to define a source-drain separator;

depositing conductive material on said substrate bearing said source-drain separator to define source and drain electrodes of said transistor, said source electrode having an edge facing said drain electrode, said drain electrode having an edge facing said source electrode;

depositing organic semiconducting material over said source and drain electrodes to provide a conducting channel between said source and drain electrodes;

depositing dielectric material over said organic semiconducting material; and depositing conductive material over said dielectric material to provide a gate electrode for said transistor, wherein the source-drain separator has an undercut edge, wherein one of the source and drain electrodes is formed over the separator structure at a first height, and the other of the source and drain electrodes is formed over the substrate at a second, lower height, wherein said channel is formed between said edges of the source and drain electrodes, and wherein substantially all said source electrode is laterally positioned to one side of said channel and substantially all said drain electrode is laterally positioned to the other side of said channel.

7. A method according to claim 6 wherein the source and drain electrodes are separated by a distance of less than 10 µm.

8. A method according to claim 6 wherein the separator structure is formed from photoresist material, and the separator structure is patterned by photopatterning to form the source-drain separator.

9. A method according to claim 6 wherein at least one of the organic semiconducting material, the dielectric material, and the gate electrode are deposited from a solution in a solvent.

10. A method according to claim 6 wherein the conductive material forming the source and drain electrodes is deposited by evaporation or sputtering.

11. A method according to claim 10 wherein said forming of said source and drain electrodes comprises directional deposition of electrode material at an angle such that a shadow of an edge of said separator structure defines an electrode edge.

12. A method according to claim 6 wherein the conductive material forming the source and drain electrodes comprises a metallic element.

13. A method according to claim 12 wherein the conductive material forming the source and drain electrodes consists essentially of an elemental metal or an alloy thereof.

14. An organic electronic device, the device comprising:
a substrate supporting a first electrode;
a separator structure over said substrate;
a second electrode over said separator structure and at a height above said first electrode, said first electrode having an edge facing said second electrode, said second electrode having an edge facing said first electrode; and
a layer of organic semiconducting material over said first and second electrodes to provide a conducting channel between said first and second electrodes; and
wherein said channel is formed between said edges of the first and second electrodes,
wherein substantially all said first electrode is laterally positioned to one side of said channel and substantially all said second electrode is laterally positioned to the other side of said channel, wherein the separator structure has an undercut edge.

15. An organic electronic device as claimed in claim 14 wherein said separator structure comprises a layer of electrically insulating material.

16. An organic electronic device as claimed in claim 14 wherein said device comprises a transistor, and wherein one of said first and second electrodes comprises a source electrode of said transistor and the other a drain electrode of said transistor, the device further comprising a layer of gate dielectric over said layer of organic semiconducting material and a gate electrode over said layer of gate dielectric.

17. An organic electronic device as claimed in claim 16 wherein said gate electrode overlies said source electrode without an intervening conducting layer and wherein said gate electrode overlies said drain electrode without an intervening conducting layer.

18. A double transistor structure comprising two transistors each as claimed in claim 16, and wherein one of said source and drain electrodes is shared between said two transistors.

19. A double transistor structure as claimed in claim 18 wherein said double transistor structure lacks an external connection to the said shared electrode.

20. An organic electronic device, the device comprising:
a substrate;
a first electrode over said substrate at a first height above said substrate;
a separator structure over said substrate;
a second electrode over said separator structure and at a second height, greater than said first height, above said substrate, said first electrode having an edge facing said second electrode, said second electrode having an edge facing said first electrode; and
a layer of organic semiconducting material over said first and second electrodes to provide a conducting channel between said first and second electrodes; and
wherein said channel is formed between said edges of the first and second electrodes,
wherein the separator structure has an undercut edge and there is substantially no lateral overlap between said first and second electrodes.

* * * * *